United States Patent [19]

Rope et al.

[11] Patent Number: 5,066,921
[45] Date of Patent: Nov. 19, 1991

[54] RADOME DIAGNOSTIC SYSTEM

[75] Inventors: Eugene L. Rope, El Cajon; Dary R. Stewart, San Diego; Gus P. Tricoles, San Diego; Gary L. Vance, San Diego; Jonathan Roussos, San Diego; Roy S. Luoma, Fallbrook, all of Calif.

[73] Assignee: General Dynamics, Electronics Division, San Diego, Calif.

[21] Appl. No.: 561,318

[22] Filed: Aug. 1, 1990

[51] Int. Cl.[5] .................... G01R 27/000; H01Q 1/420
[52] U.S. Cl. .................................. 324/639; 343/703; 343/872; 324/647
[58] Field of Search .............. 343/703, 872, 757, 760, 343/763, 765, 766; 324/601, 642, 639, 647

[56] References Cited

U.S. PATENT DOCUMENTS

| | | | |
|---|---|---|---|
| 2,952,296 | 9/1960 | Kofoid | 324/639 |
| 4,097,796 | 6/1978 | Lunden | 324/601 |
| 4,274,048 | 6/1981 | Tricoles et al. | 324/647 |
| 4,303,211 | 12/1981 | Dooley et al. | 343/872 |

OTHER PUBLICATIONS

Audone et al, Radome Design and Measurements, IEEE Transactions on Instrumentation and Measurement, vol. 37, No. 2, 6/88, pp. 292-295.

Primary Examiner—Michael C. Wimer
Assistant Examiner—Peter Toby Brown
Attorney, Agent, or Firm—Brown, Martin, Haller & McClain

[57] ABSTRACT

A radome diagnostic system comprises a rotatably mounted turntable having support memebers for supporting a radome in a radome support area on the turntable, and a scanning assembly on the turntable for supporting a probe antenna in the radome support area and for translating the probe antenna in perpendicular x and y directions to cover a predetermined planar scanning area. A reference antenna is mounted on the turntable to provide a reference signal, and both the reference antenna and the probe antenna are connected to a suitable receiver for receiving signals from them and for suitably analyzing the collected data. A transmitter is located at a position remote from the turntable to direct radiation towards a radome mounted on the turntable. The probe antenna will detect radiation as degraded or modified by the effect of the presence of the radome in the radiation path. The reference antenna receives unperturbed radiation.

11 Claims, 3 Drawing Sheets

FIG. 3

RADOME DIAGNOSTIC SYSTEM

STATEMENT OF GOVERNMENT RIGHTS

The Government has rights to this invention pursuant to Contract No. N00019-88-C-0050.

BACKGROUND OF THE INVENTION

1. Field of the Invention

The present invention relates generally to radomes and is particularly concerned with a system for testing radomes to detect defects and evaluate the radome effect on antenna patterns.

2. Description of Related Art

Localized construction flaws often arise during radome construction. Such flaws will produce anomalies in data collected or transmitted by an antenna in the radome. Often, these flaws are only discovered after installation, when compensation is much more difficult to achieve.

SUMMARY OF THE INVENTION

It is an object of this invention to provide a new and improved radome diagnostic or testing system for locating construction flaws and also to evaluate radome effects on antenna patterns.

According to the present invention, a radome diagnostic system is provided which comprises a turntable, a mounting assembly for supporting the turntable horizontally for rotation about a central vertical axis, a support assembly for mounting a radome to extend across a radome support area on the turntable, a probe antenna mounted on the turntable for movement in a first scanning path extending along the length of the radome support area and a second, transverse scanning path extending across the height of the radome, a transmitter remote from the turntable for transmitting radiation to the radome support area on the turntable, a reference antenna positioned on the turntable for receiving transmitted radiation unperturbed by any radome mounted on the turntable, and a receiver connected to the probe and reference antennas for measuring the phase and amplitude of radiation received by the probe antenna.

In practice, the probe antenna is positioned inside a radome under test mounted on the radome support assembly. The probe is scanned along a series of spaced, parallel scanning paths each extending the length or height of the radome and covering a planar scanning surface in the x- and y-directions, and the phase and intensity of radiation received by the probe antenna is sampled periodically for a fixed orientation of the radome. The reference antenna provides a phase reference. The radome orientation is then changed, by rotating the turntable, for example, around a z-axis, and the probe is again scanned along the same series of scanning paths until the entire surface of the radome has been covered. This procedure is repeated for a range of different radome orientations. The sampled data will indicate any defects in the radome, and will also enable radiation patterns to be synthesized to evaluate radome effects on antenna patterns.

Preferably, the probe antenna is adjustable to different depths into the radome, and can be positioned at the depth corresponding to the ultimate antenna positioning. Alternatively, various depths can be tested to evaluate the optimum antenna positioning when the radome is assembled with its antenna. The data at each radome orientation is summed to generate a point on the farfield radiation pattern, and the points generated are plotted to produce the radiation pattern characteristic for that radome. The effect of the radome will be to degrade the pattern, and the width of the major and minor lobes relative to the free space pattern provide important information on the radome effect. The maximum intensity of the major lobe relative to the free space maximum provides a measure of the transmittance of the radome. Fluctuations or anomalies in the collected data provide information on the position of construction flaws in the radome surface. In this way a radome can be fully evaluated before it is put into use, and corrections for radome effects on antenna operation can be built into the ultimate design.

This apparatus provides a relatively simple and accurate mechanism for evaluating radomes.

BRIEF DESCRIPTION OF THE DRAWINGS

The invention will be better understood from the following detailed description of a preferred embodiment, taken in conjunction with the accompanying drawings, in which like reference numerals refer to like parts, and in which.

DESCRIPTION OF THE PREFERRED EMBODIMENT

Figure 2:
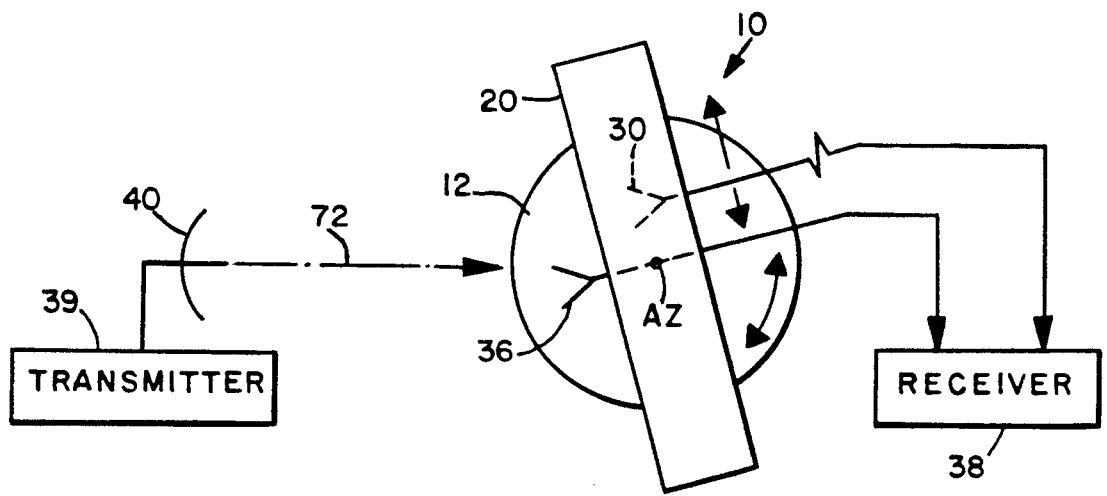
FIG. 2 is a schematic top plan view of the system.
Figure 3:
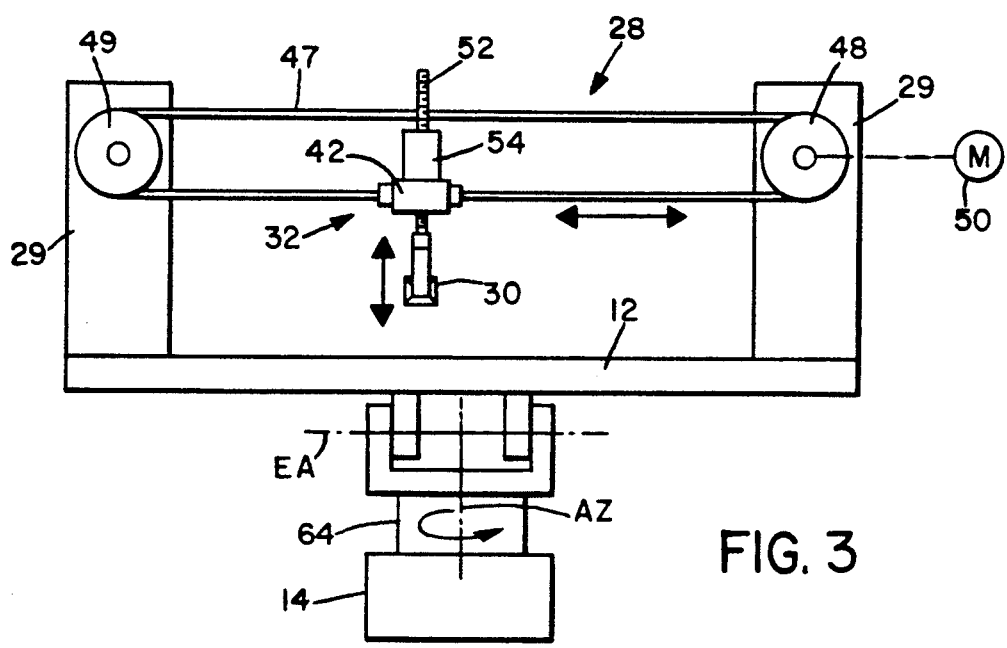
FIG. 3 illustrates the probe drive arrangement of the system.
Figure 4:
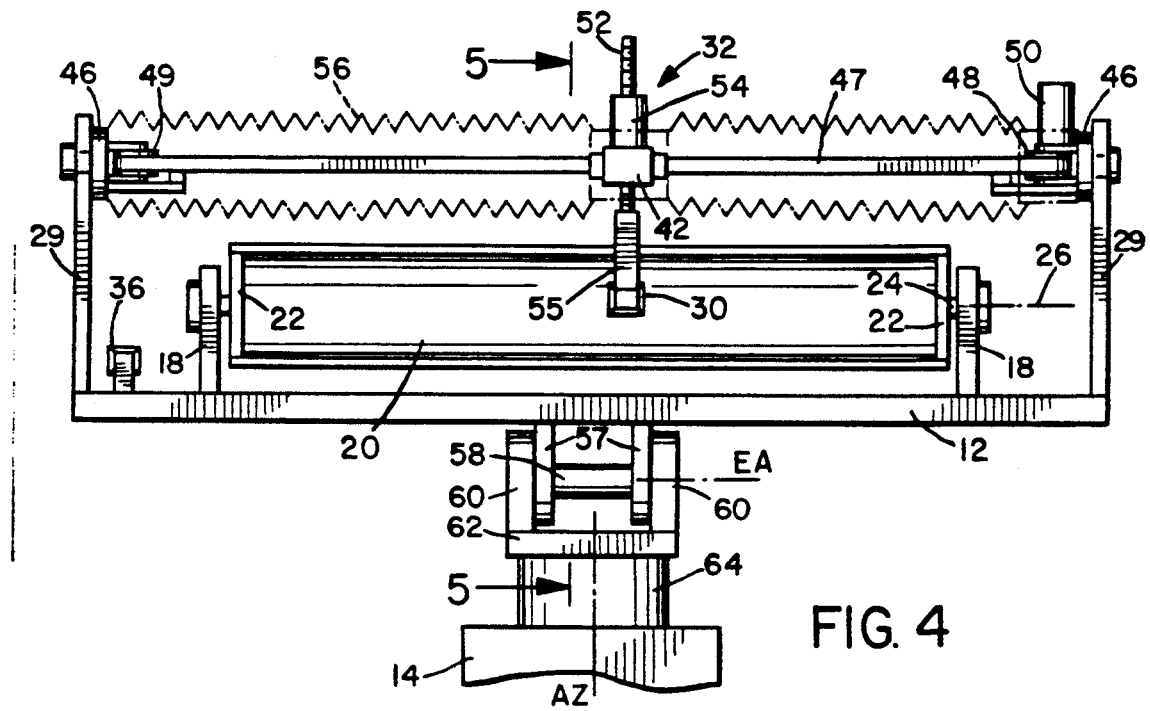
FIG. 4 is a rear elevation view of a structural configuration of the apparatus.
Figure 5:
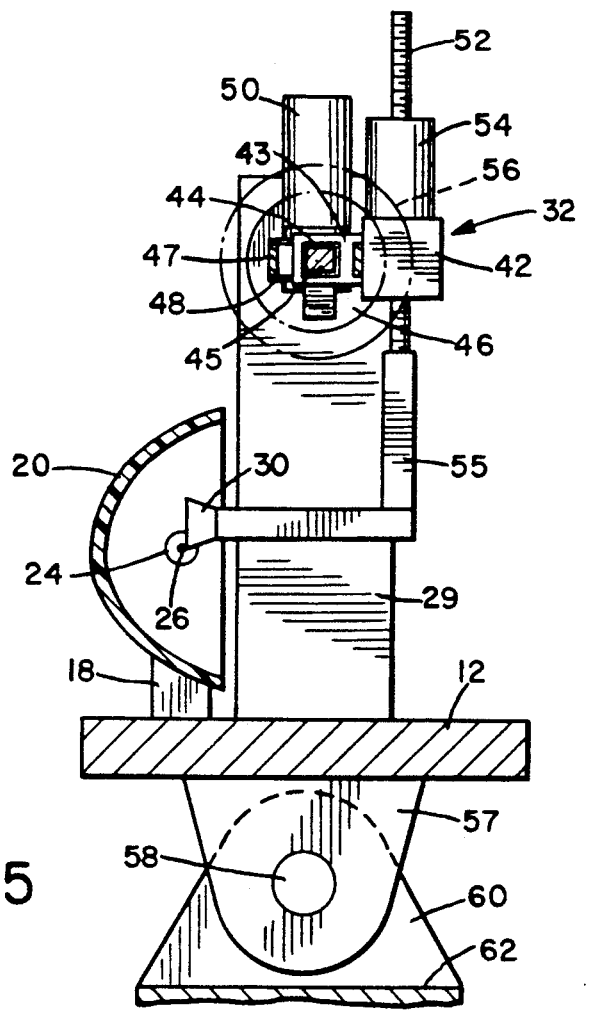
FIG. 5 is an enlarged sectional view taken on line 5—5 of FIG. 4.

The drawings illustrate an apparatus or system 10 for testing radomes according to a preferred embodiment of the present invention. The basic parts of the apparatus are illustrated schematically in FIGS. 1 and 2, and in more detail in FIGS. 3 to 5. As best illustrated in FIGS. 3 to 5, the apparatus basically comprises a horizontally supported turntable or support frame 12 which is mounted on base 14 for rotation about a central, vertical or azimuth axis AZ, and spaced vertical support arms 18 mounted on the turntable for supporting a radome 20 horizontally in a radome support area spaced above the surface of the turntable. A radome 20 to be tested rests on and is supported by end plates 22. Spindles 24 projecting outwardly from the end plates 22 are rotatably mounted on the support arms 18 to allow the radome to be tilted about a horizontal tilt or x-axis 26. Tilting may be controlled by a suitable drive motor (not illustrated) or manually, with a suitable locking mechanism (also not illustrated) for locking the radome at a desired orientation relative to tilt axis 26. A scanning assembly 28 is also mounted between end support plates 29 on the turntable or frame 12 to extend across the radome support area. The scanning assembly comprises a small receiving probe antenna 30 and a transport mechanism 32 for supporting the probe antenna for movement between end support plates 29 across a predetermined planar scanning area extending along the length of the radome 20, as will be explained in more detail below.

Figure 1:
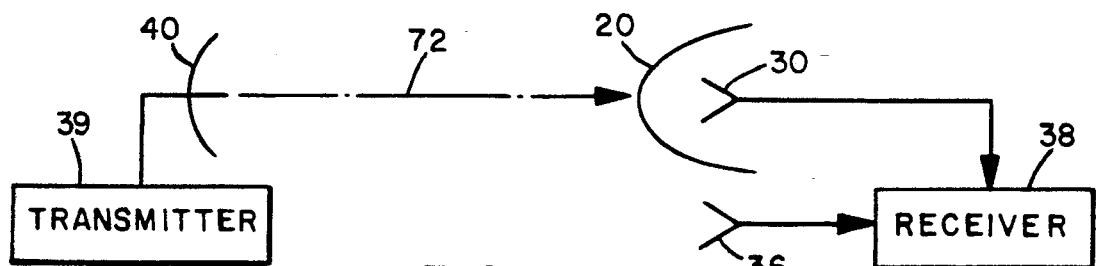
FIG. 1 is a schematic side view of the radome diagnostic system, omitting the turntable.
Figure 6:
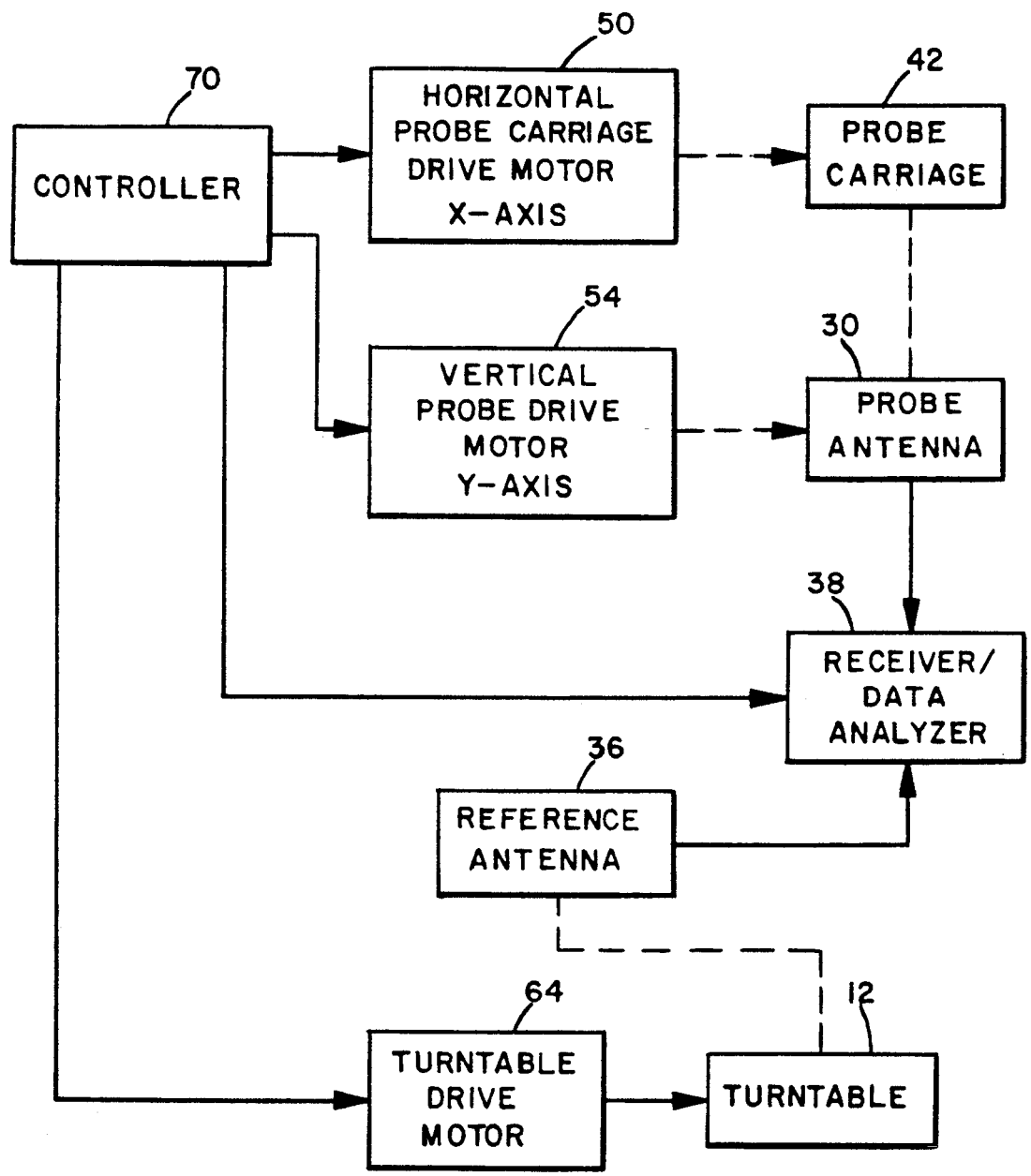
FIG. 6 is a block diagram of the control system for controlling the scanning operation.

A reference antenna 36 is also mounted on the turntable at a location spaced below the radome support area so that it can receive radiation unperturbed by the radome. As illustrated in FIGS. 1, 2 and 6, the scanning probe antenna and reference antenna are both connected to a suitable receiver 38 comprising a network analyzer of a standard type for sampling phase and intensity of received signals. As illustrated in FIGS. 1 and 2, a transmitter 39 with a transmit antenna 40 is mounted at a distance approximately 300 feet from the turntable to radiate towards the outer face of the radome on the opposite side of the radome to the probe antenna.

The support and transport mechanism for the probe antenna 30 is illustrated in more detail in FIGS. 3 to 5. A sliding carriage 42 has a bracket 43 with a square through bore 44 which projects sideways from the carriage 42 and is slidably supported on a square cross section support rod 45 which extends between end supports 46 mounted on end plates 29. The bracket is secured to drive belt 47 which extends in opposite directions from the bracket around pulley or drive wheels 48, 49 rotatably mounted on the respective end supports 29, as best illustrated in FIG. 3. One of the drive wheels 48 is driven by belt or x-axis drive motor 50, which is preferably a stepper motor.

The probe antenna is suspended from the lower end of a vertical feed or lead screw 52 which extends through lead screw or y-axis stepper motor 54 mounted on carriage 42 (see FIGS. 4 and 5). The armature of motor 54 comprises a nut on screw 52, such that rotation of motor armature will cause the screw to travel upwardly or downwardly through motor 54, depending on the drive direction, as indicated by the vertical arrow in FIG. 3. The probe antenna 30 is mounted on the outer end of an L shaped bracket 55 suspended from the lower end of screw 52, so that it projects into the radome area as illustrated in FIG. 5. This arrangement allows the probe antenna to be scanned along a series of parallel, vertically spaced horizontal or x-axis scanning paths along the length of the radome defining a planar scanning surface. Alternatively, the probe antenna may be scanned along a series of parallel, horizontally spaced vertical or y-axis scanning paths, by suitable co-ordination of the drive of motors 50 and 54. Preferably, bracket 55 includes an adjustment mechanism (not illustrated) for controlling the depth of probe into radome 20. This allows the probe antenna to be positioned manually to various depths into the radome. The entire scanning assembly may be enclosed in protective bellows 56, as indicated in FIG. 4.

In the preferred embodiment of the invention illustrated in the drawings, the turntable is mounted to allow tilting about horizontal tilt axis EA (see FIG. 3) as well as rotation about vertical rotation axis AZ. As best illustrated in FIGS. 4 and 5, the turntable 12 has a pair of spaced, downwardly projecting yokes 57 which are mounted on horizontal spindle 58 rotatably mounted between end supports 60 of U-shaped support member 62. Support member 62 is itself mounted on the drive shaft of turntable drive motor 64, which is preferably also a stepper motor, and which is supported on base 14. A suitable motor (not illustrated) may also be provided for controlling tilting of the turntable about axis EA, and for locking the turntable in a selected tilt orientation.

The apparatus is used to evaluate a radome by rotating the turntable through a range of different orientations relative to the transmitted radiation, and scanning the probe antenna across a planar surface in the radome at each orientation. FIG. 6 illustrates a suitable control circuit for controlling the scanning operation according to a predetermined scanning sequence for covering a scanning plane across the radome area. A suitable controller 70, which may comprise a suitable programmed computer or microprocessor, is connected to each of the three stepper motors 50, 54 and 64. The controller is programmed to control the turntable motor to rotate the turntable between a range of angles relative to the transmitter axis 72. For example, if the transmitter axis is considered to be the 0 degree orientation, the turntable may be rotated in incremental steps through 120 degrees to cover radome length orientations perpendicular to the transmitter axis and from +60 degrees to −60 degrees from this orientation. At each radome scanning orientation, the stationary reference antenna on the turntable provides a phase reference signal. Once a desired scanning orientation is reached, the turntable motor is switched off and the belt drive motor is operated to drive the carriage carrying the probe antenna in a series of incremental steps across a first scanning path extending the length of the radome. At each step, phase and intensity of radiation transmitted from transmit antenna 40 and received by probe antenna 30 is collected by the receiver 38. Once the probe has travelled the length of the radome, the servo-controlled, screw drive motor 54 drives the bracket carrying the probe up or down to a new position. The belt drive motor is again activated to drive the carriage back to move the probe along a second parallel scanning path spaced vertically from the first path. This procedure is repeated until the probe has effectively covered an entire planar surface at a predetermined depth in the radome. Phase and intensity are sampled by the receiver at fixed intervals while the probe is translated across the scanning surface. The sample data are summed to generate a point on the farfield radiation pattern. If $u(x_n)$ represents the complex value or amplitude at a particular point in the scan, and there are N sampled values, the farfield pattern amplitude is:

$$u_f = \sum_{n=1}^{N} u(x_n)$$

The corresponding intensity of the farfield pattern is $(u_F)^2$.

This procedure is repeated over a range of different radome orientations relative to the transmitter, for example a range from +60 to −60 degrees relative to a central, zero position where the radome is perpendicular to a line extending from the transmitter to the radome. For each orientation in the range, the probe antenna is scanned across a scanning surface and the sampled data is summed to generate a point on the radiation pattern. This results in a radiation pattern which is of equivalent shape to the standard farfield free space radiation pattern but degraded by the radome absorbing or deflecting some of the radiation. Comparison of the synthesized pattern with the free space pattern allows radome effects to be evaluated. For example, the maximum intensity relative to the free space maximum provides an indication of the radome transmittance. Anomalies or fluctuations in the data indicate the presence of construction flaws in the radome, which effectively cast a shadow on the probe antenna and cause a minimum or reduction in the scanned intensity. Such flaws can be precisely located according to the position of fluctuation in the scanned data.

The scanning procedure may also be repeated for different radome tilt angles and/or turntable tilt angles, and at various probe antenna depths into the radome. The probe antenna may be scanned at various depths to determine an optimum antenna position, or may be positioned at the depth corresponding to the ultimate antenna positioning on installation. This allows many problems to be avoided in advance, by completely testing the radome prior to actual installation.

This technique allows a radome to be fully evaluated during development rather than after installation of the radar antenna, and allows compensation for radome effects in the ultimate installation to be made in a relatively easy manner. The positioning of the probe antenna can be selected according to the particular antenna installation for which the radome is to be used, so that the effect of the radome on an antenna at that position can be fully evaluated in advance. The technique can also be used to work out an optimum antenna position by scanning the entire internal volume of the radome. Tilting of the radome and/or turntable may be necessary in some cases to evaluate the radome effects on various different types of antenna. Operation of the various drive motors controlling rotation of the radome and movement of the probe antenna across a scanning plane may be automatically controlled via a suitably programmed microprocessor controller. The theoretical analysis necessary to generate a far field radiation pattern from collected data is well known in the antenna field and need not be described in any more detail here. Once the data has been collected, a suitably programmed computer can be used to generate or synthesize the radiation pattern.

The apparatus and method for testing radomes as described above allows radome effects to be evaluated fully in a relatively easy and efficient manner in advance of any installation.

Although a preferred embodiment of the invention has been described above by way of example only, it will be understood by those skilled in the field that modifications may be made to the disclosed embodiment without departing from the scope of the invention, which is defined by the appended claims.

We claim:

1. A radome diagnostic system, comprising:
a turntable;
mounting means for rotatably mounting the turntable horizontally for rotation about a central, vertical axis;
support means on the turntable for mounting a radome in a radome support area extending across the turntable;
transmitter means remote from the turntable for directing radiation towards the radome support area on the turntable;
a scanning assembly mounted on the turntable including a probe antenna for receiving radiation transmitted from said transmitter means through said radome, and scanning means for mounting the probe antenna for movement along a series of parallel scanning paths over a scanning plane in the radome support area;
a reference antenna at a fixed position on the turntable for receiving radiation transmitted from the transmitter means to provide a reference signal, said radiation received by said reference antenna being unperturbed by said radome mounted in said radome support area; and
receiver means connected to the probe antenna and reference antenna for sampling the phase and amplitude of radiation received by said probe antenna relative to said reference signal.

2. The system as claimed in claim 1, including tilt means for tilting the turntable about a horizontal axis.

3. The system as claimed in claim 1, wherein said support means includes radome tilt means for tilting said radome about a horizontal axis spaced above the turntable.

4. The system as claimed in claim 1, wherein the radome support means comprises means for supporting the radome horizontally at a position spaced above the turntable, and the reference antenna is spaced from said radome to receive radiation directly from said transmitter means and unperturbed by said radome.

5. The system as claimed in claim 1, wherein the scanning means comprises a carriage, slidable mounting means for slidably mounting the carriage for movement in a horizontal path above the turntable at a location spaced from the radome support area, carriage drive means for driving the carriage along the carriage path, probe support means for slidably mounting the probe antenna for vertical movement on the carriage, and probe drive means for driving the probe antenna up and down relative to the carriage.

6. The system as claimed in claim 5, including control means for automatically controlling the carriage and probe drive means for translating the probe across a predetermined planar scanning area within the radome support area.

7. The system as claimed in claim 1, including turntable drive means for driving the turntable to rotate about the first, vertical axis; first, x-direction probe drive means for driving the probe antenna in a first direction parallel to the plane of the turntable and second, y-direction probe drive means for driving the probe antenna in a second direction perpendicular to the turntable.

8. The system as claimed in claim 7, including control means for automatically controlling said turntable for moving the turntable between a range of different radome orientations relative to the transmitter and said first and second probe drive means for moving the probe antenna across a predetermined scanning area at each radome orientation.

9. A radome testing apparatus, comprising:
a horizontal support member;
rotatable mounting means for rotatably mounting the support member for rotation about a vertical axis;
radome support means on the support member for supporting a radome in a radome support area;
transmitter means remote from said support member for directing radiation towards the outer surface of a radome mounted in said radome support area;
a scanning assembly mounted on the support member adjacent the radome support area, the scanning assembly comprising a probe antenna projecting into the radome support area for receiving radiation transmitted from the transmitter means through the radome, and perpendicular x and y direction translating means for moving the probe antenna across a predetermined scanning area in the radome support area;

a reference antenna mounted at a fixed position on the support member for receiving radiation transmitted from the transmitter means to generate a reference signal; and receiver means connected to said probe antenna and reference antenna for sampling the phase and amplitude or radiation received by said probe antenna across said scanning area and comparing it to said reference signal.

10. The apparatus as claimed in claim 9, wherein said receiver means includes means for sampling data from said probe antenna at a series of different radome orientations and means for generating a synthesized farfield radiation pattern from said sampled data.

11. A radome testing method, comprising the steps of:

mounting a radome with one side directed towards a transmitter transmitting radiation towards the radome;

mounting a probe antenna on the opposite side of the radome to the transmitter for movement along a scanning path along the length of the radome;

mounting a reference antenna at a position for receiving radiation from the transmitter unperturbed by the radome;

carrying out a scanning procedure comprising scanning the probe antenna along a series of spaced parallel scanning paths at a predetermined depth in the radome with the radome at a first orientation relative to the transmitter;

carrying out a sampling procedure comprising sampling the signals received by the probe antenna at spaced locations along each scanning path during the scanning procedure;

rotating the radome to a second angular orientation relative to the transmitter;

repeating the scanning and sampling procedure at the second orientation;

rotating the radome through a range of different angular orientations and repeating the scanning and sampling procedures at each angular orientation to scan the entire surface area of the radome; and using the sampled signals to synthesize a radiation pattern.

* * * * *